(12) United States Patent
Czornomaz et al.

(10) Patent No.: US 9,989,703 B2
(45) Date of Patent: Jun. 5, 2018

(54) SEMICONDUCTOR STRUCTURE AND METHOD FOR MANUFACTURING A SEMICONDUCTOR STRUCTURE

(71) Applicant: International Business Machines Corporation, Armonk, NY (US)

(72) Inventors: Lukas Czornomaz, Zurich (CH); Jean Fompeyrine, Waedenswil (CH); Jens Hofrichter, Gattikon (CH); Bert Jan Offrein, Schoenenberg (CH); Mirja Richter, Staefa (CH)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/379,523

(22) Filed: Dec. 15, 2016

(65) Prior Publication Data

US 2017/0097468 A1    Apr. 6, 2017

Related U.S. Application Data

(62) Division of application No. 14/442,240, filed as application No. PCT/IB2013/060435 on Nov. 27, 2013.

(30) Foreign Application Priority Data

Nov. 30, 2012  (GB) .................................. 1221581.0

(51) Int. Cl.
*G02B 6/13* (2006.01)
*H01L 23/544* (2006.01)
*G02B 6/12* (2006.01)

(52) U.S. Cl.
CPC .......... *G02B 6/13* (2013.01); *G02B 6/12004* (2013.01); *G02B 6/131* (2013.01); *H01L 23/544* (2013.01); *H01L 2223/54426* (2013.01)

(58) Field of Classification Search
CPC .................................................. G02B 6/12004
See application file for complete search history.

(56) References Cited

U.S. PATENT DOCUMENTS 6,884,648 B2 *  4/2005  Hasegawa .............. B82Y 20/00
                                                       438/34
6,968,110 B2 * 11/2005  Patel .................. G02B 6/12004
                                                       257/431

(Continued)

FOREIGN PATENT DOCUMENTS

CN     102117820 A     7/2011
CN     102487046 A     6/2012

(Continued)

OTHER PUBLICATIONS

Appendix P, List of IBM Patents or Patent Applications Treated as Related, 2 pages, dated Dec. 15, 2016.

(Continued)

*Primary Examiner* — Daniel Petkovsek
(74) *Attorney, Agent, or Firm* — Bryan D. Wells

(57) ABSTRACT

A semiconductor structure and a method for manufacturing the semiconductor structure are provided. The semiconductor structure includes a processed semiconductor substrate. The processed semiconductor substrate includes active electronic components. The semiconductor structure also includes a dielectric layer that covers, at least partially, the processed semiconductor substrate. An interface layer that is suitable for growing optically active material on the interface layer is bonded to the dielectric layer. An optical gain layer and the processed semiconductor substrate are connected through the dielectric layer by electric and/or optical contacts.

8 Claims, 10 Drawing Sheets

(56) References Cited

U.S. PATENT DOCUMENTS

| | | | |
|---|---|---|---|
| 7,109,051 B2* | 9/2006 | Cave | H01L 27/144 257/E27.12 |
| 7,203,387 B2 | 4/2007 | Doan | |
| 7,257,283 B1 | 8/2007 | Liu et al. | |
| 7,719,073 B2* | 5/2010 | Kamins | H01L 31/02002 257/432 |
| 7,734,123 B2 | 6/2010 | Bar et al. | |
| 8,110,823 B2 | 2/2012 | Bowers | |
| 8,213,751 B1 | 7/2012 | Ho et al. | |
| 8,249,402 B2* | 8/2012 | Asai | G02B 6/43 385/131 |
| 8,280,207 B2 | 10/2012 | Pinguet et al. | |
| 8,364,001 B2* | 1/2013 | Fujii | B32B 38/04 385/131 |
| 8,532,440 B2* | 9/2013 | Ushida | G02F 1/025 385/131 |
| 9,620,489 B2* | 4/2017 | Lipson | H01L 25/167 |
| 2006/0177173 A1* | 8/2006 | Shastri | G02B 6/42 385/14 |
| 2007/0170417 A1 | 7/2007 | Bowers | |
| 2009/0016399 A1 | 1/2009 | Bowers | |
| 2009/0245298 A1 | 10/2009 | Sysak et al. | |
| 2010/0295083 A1 | 11/2010 | Celler | |
| 2011/0135252 A1 | 6/2011 | Kim et al. | |
| 2011/0158278 A1 | 6/2011 | Koch | |
| 2011/0267676 A1 | 11/2011 | Dallesasse et al. | |
| 2011/0278441 A1 | 11/2011 | Vermeulen et al. | |
| 2012/0001166 A1 | 1/2012 | Doany et al. | |
| 2012/0228582 A1 | 9/2012 | Ma et al. | |
| 2013/0200431 A1* | 8/2013 | Coimbatore Balram | H01L 21/02381 257/183 |
| 2015/0115320 A1 | 4/2015 | Lochtefeld | |
| 2016/0334574 A1* | 11/2016 | Czornomaz | G02B 6/12004 |

FOREIGN PATENT DOCUMENTS

| | | |
|---|---|---|
| GB | 2513531 A | 11/2014 |
| WO | 2011037686 A1 | 3/2011 |
| WO | 2014083507 A2 | 6/2014 |
| WO | 2014083507 A3 | 6/2014 |

OTHER PUBLICATIONS

Assefa et al., "CMOS Integrated Nanophotonics—Enabling Technology for Exascale Computing Systems", © 2010 Optical Society of America, Optical Fiber Communication Conference and Exposition (OFC/NFOEC), 2011 and the National Fiber Optic Engineers Conference, Publication Year: 2011, pp. 1-3.

Boucart et al., "Metamorphic DBR and Tunnel-Junction Injection: A CW RT Monolithic Long-Wavelength VCSEL", IEEE Journal of Selected Topics in Quantum Electronics, vol. 5, No. 3, May/Jun. 1999, pp. 520-529, © 1999 IEEE.

Campenhout et al., "Electrically pumped InP-based microdisk lasers integrated with a nanophotonic silicon-on-insulator waveguide circuit", May 28, 2007 / vol. 15, No. 11 / Optics Express, published May 17, 2007, pp. 6744-6749, © 2007 Optical Society of America.

Fedeli, Jean-Marc, "Si and InP Integration in the HELIOS project1", ECOC 2009, Sep. 20-24, 2009, Vienna, Austria, © VDE Verlag Gmbh, pp. 1-3, Paper 2.7.4.

Goebel et al., "Method and process flow for CMOS compatible photonics integration", Phys. Status Solidi C 8, No. 9, pp. 2969-2972, Published online May 31, 2011, Wiley Online Library, © 2011 Wiley-VCH VerlagGmbH & Co. KGaA, Weinheim.

Kostrzewa et al., "InP dies transferred onto silicon substrate for optical interconnects application", Copyright © 2005 Elsevier B.V., Received May 20, 2005; received in revised form Jul. 24, 2005; accepted Jul. 24, 2005, Available online Oct. 7, 2005, pp. 411-414.

Li et al., "Electrical Pumping Febry-Perot Lasing of 111-V Layer on Highly Doped Silicon Micro Rib by Plasma Assisted Direct Bonding", 23rd International Conference on Indium Phosphide and Related Materials—IPRM 2011, May 22-26, 2011, Berlin, Germany, © VDE Verlag GmbH—Berlin—Offenbach, pp. 1-4.

Palit et al., "Low-threshold thin-film III-V lasers bonded to silicon with front and back side defined features", Optics Letters, vol. 34, No. 18, Sep. 15, 2009, pp. 2802-2804, © 2009 Optical Society of America.

Spuesens et al., "CW operation of III-V microdisk lasers on SOI fabricated in a 200 mm CMOS pilot line", 2011 8th IEEE International Conference on Group IV Photonics (GFP), © 2011 IEEE, pp. 199-201.

Tani et al., "Ge(111)-Fin Light-Emitting Diodes", 2011 8th IEEE International Conference on Group IV Photonics (GFP) © 2011 IEEE, pp. 217-219.

Thacker et al., "Hybrid Integration of Silicon Nanophotonics with 40nm-CMOS VLSI Drivers and Receivers", 2011 Electronic Components and Technology Conference, © 2011 IEEE, pp. 829-835.

Patents Act 1977: Search Report under Section 17(5). Intellectual Property Office, Application No. GB1221581.0, dated Mar. 25, 2013.

Czornomaz et al., "Semiconductor Structure and Method for Manufacturing a Semiconductor Structure", U.S. Appl. No. 14/442,240, filed May 12, 2015, 31 pages.

* cited by examiner

SEMICONDUCTOR STRUCTURE AND METHOD FOR MANUFACTURING A SEMICONDUCTOR STRUCTURE

BACKGROUND

This disclosure relates to a semiconductor structure, and more particularly to a semiconductor structure including conventional silicon-based integrated circuits combined with photonic components based on optically active semiconductor materials. This disclosure also provides a method of fabricating such a semiconductor structure.

In order to obtain high speed signal transmissions and processing, it is desirable to use light instead of electric currents for the transmission of signals. However, photonic components realizing optical storage, imaging, modulation, optical sensing and light sources are difficult to integrate with state of the art CMOS or BiCMOS electronic circuits. This is because silicon-based technology or silicon has an indirect band gap, which is less suitable for realizing light sources. Rather, semiconductor materials having a direct band gap as, for example, III-V semiconductor compounds exhibit optical gain. The integration of so-called compound semiconductors with silicon is difficult because of a large lattice mismatch between the semiconductors.

U.S. 2007/0170417 A1 proposes the integration of photonic circuits on silicon. By bonding a wafer of III-V material as an active region to silicon and removing the substrate, lasers, amplifiers, modulators and other devices are processed using standard photolithographic techniques on the silicon substrate. According to U.S. 2007/0170417 A1, the compound materials are directly bonded onto the silicon wafer having a pre-structured photonic circuit. Any active electronic components, like for example transistors, are eventually fabricated in the silicon domain.

It is still desirable to improve integrated optics, in particular silicon photonics.

SUMMARY

It is an aspect of the present disclosure to provide improved semiconductor structures based on conventional driving circuitry, for example based on silicon processes, and optically active semiconductor materials in one chip. Other aspects relate to improved methods for fabricating such a semiconductor structure.

According to an embodiment of one aspect of the invention a semiconductor structure is disclosed, wherein the semiconductor structure comprises: a processed semiconductor substrate including active electronic components; a dielectric layer covering at least partially the processed semiconductor substrate; and an interface layer which is suitable for growing optically active material on the interface layer, wherein the interface layer is bonded to the dielectric layer; wherein the optical interface layer and the processed semiconductor substrate are connected through the dielectric layer by electric and/or optical contacts.

Bonding the interface layer onto the dielectric layer allows using prefabricated semiconductor substrates, for example comprising driving circuitry for photonic components, such as a light source. A semiconductor wafer can be e.g. considered as a processed semiconductor substrate having active electronic components.

The interface layer is suitable or adapted for growing an optically active material on it. For example, the interface layer may exhibit a crystal lattice structure that is compatible with the epitaxial growth of other suitable materials that are optically active. An optically active material may be considered as a material that has specific optical properties. An optically active material may exhibit optical gain and may be used for realizing a light source. According to embodiments of the invention "optically active material" refers to a material that is suitable as a transfer medium for light, a modulating medium for light, a gain medium or laser medium and may show optical gain. For example, quantum wells and quantum dots based on specific bulk materials can form active optical amplifying media. Usually silicon semiconductor material is considered not optically active.

In embodiments the interface layer may comprise optically active material itself. However, according to embodiments of the invention the interface layer can also be considered a seed layer for growing the optically active layer. When the interface layer itself shows optical gain one may also refer to an "optical gain layer".

According to embodiments of the invention an optical contact is considered a coupling that allows for any transfer of an optical signal through the dielectric layer. One may contemplate of various implementations, e.g. a cavity, a waveguide, or other means for coupling two terminals.

The processed semiconductor substrate may also include photonic components, such as optical waveguides, grating couplers, resonators, wavelength splitters or sensors. The bonding between the interface layer and the dielectric layer can be based on molecular bonding.

In embodiments of the semiconductor structure, the processed semiconductor substrate includes at least one of the group of: drive electronics, an optical waveguide, transistor, memory, an amplifier circuit or resistor. The semiconductor structure may include in particular silicon photonics components. An active electronic component may be implemented to amplify an electric current or voltage. The semiconductor structure may comprise any front-end-related components.

In embodiments, the processed semiconductor substrate is at least a part of a processed CMOS wafer including front-end electronic and/or front-end photonic components. One may consider the front-end-of-line processes in a CMOS flow any process that is performed before aluminum or copper interconnects are fabricated. However, one can also contemplate of other definitions for front-end processes or front-end electronics. In contrast to back-end of line or back-side processes front-end of line processes refer to local electrical or optical coupling of the respective components, which are inherently not feasible with the other approaches.

According to one embodiment of the semiconductor structure the processed semiconductor substrate exclusively contains front-end components.

Preferably the processed semiconductor substrate and the optical active layer or the structures optical active layer share the same interconnects. Hence, efficient system-on-chips become feasible, where optically active and electronic functions based on conventional fabrication processes are combined.

In embodiments of the semiconductor structure, the interface layer comprises at least one of the group of: a compound semiconductor material having a direct band gap, and germanium. For example, compound semiconductors, such as III-V or II-V materials or germanium, can be electrically pumped and exhibit optical gain. A compound semiconductor material of the optical gain layer preferably includes a III-V compound semiconductor material, or a II-VI compound semiconductor material. For example, the compound semiconductor material is $In_xGa_{(1-x)}As$ where $0<x<1$, InP, InGaAs, InAlAs, InGaAsP, GaNAsP, or GaSb or any alloy thereof. One may also contemplate of germanium as optically active material.

The interface layer itself or an attached or grown optical gain layer can be further structured and, for example, includes one of the group of: an optical waveguide, a modulator, a polarization rotator, a grating coupler, a photo detector, a photodiode, a quantum well stack, a light source, a laser, an optical amplifier, a dielectric back refractor laser, a distributed feedback laser and a vertical cavity surface emitting laser.

The interface layer or optically active material grown on the interface layer can comprise confinement structures that are fabricated according to known process technologies. For example, quantum wells, quantum wires, nanowires and/or quantum dots may be comprised in the optically active material.

When fabricating the semiconductor structure, the photonic components in the optically active layer can be fabricated after the entire semiconductor substrate, such as a CMOS wafer, is completely processed except for aluminum or copper interconnects and the dielectric layers in between separating the several metal layers or levels. Optical and/or electric contacts then directly connect the front-end components, for example silicon-based electronics and driver circuitry, to the compound semiconductor-based photonics including, for example, a light source in terms of a laser. Hence, a very compact and efficient configuration is provided.

In embodiments, the interface layer may be a seed layer having a lattice constant suitable for successive growth of optically active material. When producing the semiconductor structure, for example, first the seed layer is bonded to the dielectric layer and consequently, an optical gain layer to be processed can be grown.

In some embodiments of the semiconductor structure, the dielectric layer is a first interlayer dielectric. The first interlayer dielectric ILD1 in standard CMOS processes, for example after planarization, is suitable for bonding with III-V compound semiconductors or germanium. In one embodiment the planarization is performed by chemical-mechanical polishing (CMP).

An embodiment of the semiconductor structure comprises a CMOS wafer including front-end electronic and/or front-end photonic components, a dielectric layer covering at least partially the processed CMOS wafer, a compound semiconductor or a germanium layer bonded to the dielectric layer, wherein the front-end electronic and/or photonic components are coupled with the compound semiconductor or germanium layer through the dielectric layer for signal transmission.

In embodiments of the semiconductor structure the dielectric layer has a thickness between 10 nm and 1 μm. Preferably, the thickness is less than 500 nm, and even more preferred the dielectric layer has a thickness less than 300 nm.

According to an embodiment of another aspect of the invention a semiconductor device is provided comprising a semiconductor structure according to any of the above mentioned embodiments of the semiconductor structure aspect.

According to an embodiment of another aspect of the invention a method for fabricating a semiconductor structure, as, for example, the above-depicted semiconductor structure, may comprise: providing a processed semiconductor substrate including active electronic components; depositing a dielectric layer covering at least partially the processed semiconductor substrate; bonding an interface layer to the dielectric layer wherein the interface layer is suitable for growing optically active material on the interface layer; and connecting the interface layer and the processed semiconductor substrate with each other through the dielectric layer by electric and/or optical contacts.

The method for fabricating a semiconductor structure allows for the integration of, for example, a light source based on a compound semiconductor with a prefabricated, for example CMOS front-end comprising active electronic and/or photonic components based on silicon. In particular, the first interlayer dielectric ILD 1 can act as the bonding interface.

Preferably, the dielectric layer is fabricated as to have a thickness between 10 nm and 1 μm. Preferably, the thickness is less than 500 nm, and even more preferred the dielectric layer has a thickness less than 300 nm. In embodiments the thickness may be larger than 100 nm but less than the values mentioned before.

In embodiments of the method, the step of providing a processed semiconductor substrate comprises providing a processed CMOS wafer including front-end electronics and/or front-end photonics components. For example, in conventional CMOS processes, the dielectric layer is a silicon dioxide layer which can be polished or planarized. For example, one may employ chemo-mechanical polishing to provide a flat surface exhibiting low surface roughness.

According to one embodiment of the method exclusively front-end components are fabricated on or on the processed semiconductor substrate before bonding.

The interface layer or an optical gain layer grown on the interface layer preferably comprises at least one of the group of a compound semiconductor material having a direct band gap and germanium. For example, compound semiconductors, such as III-V or II-V materials or germanium, can be electrically pumped and exhibit optical gain. A compound semiconductor material of the optical gain layer preferably includes a III-V compound semiconductor material, or a II-VI compound semiconductor material. For example, the compound semiconductor material is $In_xGa_{(1-x)}As$ where $0<x<1$, InP, InGeAs, InAlAs, InGaAsP, NAsP, or GaSb or any alloy thereof. One may also contemplate of strained layers including multiple quantum wells, quantum wires or strained germanium as optically active material or other confined structures.

The method for fabricating a semiconductor structure may further comprise the steps of providing the interface layer or an optical gain layer on a substrate and removing the substrate from the interface layer or the optical gain layer after bonding.

For example, when using III-V compound semiconductors as optically active material, suitable substrates are III-V semiconductor compounds, silicon, germanium or the like. One may contemplate of providing a cladding layer on the surface of the interface layer or optical gain layer as a dielectric film. Then, the cladding layer or dielectric film is bonded with a dielectric layer that covers the processed semiconductor substrate. The cladding layer or film, for example, can be applied to the compound semiconductor or germanium by molecular beam epitaxy, molecular vapor phase epitaxy, atomic layer epitaxy, atomic layer depositions, chemical vapor deposition sputtering or any other suitable thin-film deposition technique.

The bonded interface layer can be used as a seed layer, and additional optically active material is grown onto the seed layer. One may also contemplate of bonding a complete compound layer stack serving as gain material onto the dielectric layer. The interface layer itself can be an optically active layer.

The step of bonding is preferably performed at temperatures between 20° C. and 600° C. Preferably, the bonding is performed between 150° C. and 450° C. It is even more preferred, if the bonding occurs at temperatures between 200 and 300° C.

In embodiments of the method, after the step of bonding, structuring the optically active layer for forming photonic components is performed.

For example, an optical gain layer included in the interface layer or grown using the interface layer comprises a III-V compound semiconductor material or germanium and is structured to implement confinements. The optically material may be structured to implement an optical waveguide, a modulator, a polarization rotator, a grating coupler, a photo detector, a photodiode, a quantum well stack, a light source, a laser, a dielectric back refractor laser, a distribute feedback laser or a vertical cavity surface emitting laser. It is an advantage that first the front-end of the line components are fabricated and processed in the substrate, for example in a silicon wafer which may require temperatures that are not compatible with compound semiconductor materials.

In embodiments, the processed semiconductor substrate, as for example a CMOS wafer, comprises alignment markers.

Eventually, structuring the optical gain layer is performed by at least one structuring tool that is aligned relative to the alignment markers. In contrast to conventional approaches where first light sources are fabricated by the use of compound semiconductors, and second assembly process with silicon-based fully processed circuitry is performed, the alignment and electric and optical coupling between two preprocessed components requires more effort. Typically pick-and-place tools and/or wire bonding methods are employed, which are limited in speed and costly. On the contrary, the proposed method makes use of the alignment markers already present from the silicon processing which can be re-used when processing the optical active layer, as for example III-V compound layers.

In embodiments of the method for fabricating a semiconductor structure, the step of connecting the interface layer or an optically active layer with the processed semiconductor substrate is a back-end of the line process. A back-end of the line process is used to form global interconnects, while the front-end of the line process is used to form circuit elements and local interconnects. The primary purpose of a back-end of the line process is to wire together all the transistors and active components defined by the front-end of the line processes, in particular the CMOS semiconductors and the compound semiconductor-based photonic components.

Further possible implementations or variants of the invention also encompass combinations not explicitly mentioned of features described above or below with regard to the exemplary embodiments. In particular, where features are described herein with reference to an embodiment of one aspect of the invention, corresponding features may be provided in embodiments of another aspect of the invention as appropriate.

BRIEF DESCRIPTION OF THE DRAWINGS

In the following, embodiments of semiconductor structures and methods and devices relating to the manufacture of semiconductor structures are described with reference to the enclosed drawings.

Like or functionally like elements in the drawings have been allotted the same reference characters, if not otherwise indicated.

DETAILED DESCRIPTION

Figure 1:
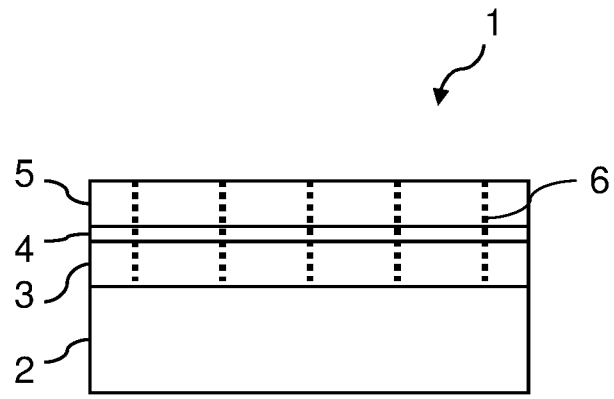
FIG. 1 shows a schematic diagram of an embodiment of a semiconductor structure.

Like or functionally like elements in the drawings have been allotted the same reference characters if not otherwise indicated.

FIG. 1 shows a schematic diagram of an embodiment of a semiconductor structure 1. The semiconductor structure 1 comprises a substrate 2 which can be part of a semiconductor wafer adapted for CMOS processing, for instance. The semiconductor substrate 2 has been already processed in some way. The processing includes in particular providing/integrating active components 3. Active components can be, for example, transistors, amplifiers, driving circuitry, processing devices, such as microcontrollers, or the like. The semiconductor substrate 2 is preferably silicon-based and may also comprise photonic components.

The processed silicon substrate 2, 3 is covered with dielectric 4. For example, the dielectric is a buried oxide or silicon oxide. The physical thickness of the dielectric material 4 may vary, but typically, the dielectric layer 4 has a thickness from about 10 nm to about 500 nm. The dielectric material may be formed in-situ utilizing any conventional deposition process including, for example, chemical vapor deposition, PECVD, atomic layer deposition, chemical solution deposition, MOCVD, evaporation and other like deposition processes.

Onto the dielectric layer 4, an interface layer is bonded, wherein the interface layer 5 allows for growing optically active material that can be patterned and structured eventually. The interface layer 5 may be a seed layer for forming an optical gain layer that comprises optically active material exhibiting optical gain.

The interface layer 5 has preferably a crystal lattice that is compatible with the lattice of an optically active material. Hence, the interface layer 5 and the dielectric layer 4 allow for a combination of conventional semiconductors 2, 3 with optically active semiconductors 5 in one chip 1. It is understood that the interface layer 5 itself can be an optical gain layer. In the following, the examples are presented where the interface layer shows optical gain. However, one may contemplate of other materials for an interface layer 5 that are suitable for growing an optical active layer or material exhibiting optical gain. The interface layer may also be considered a seed layer.

In the presented examples the interface layer or optical gain layer 5 is a III-V compound semiconductor, e.g. GaAs. In this disclosure, a III-V compound semiconductor material is a semiconductor material that includes at least one element or a mixture of elements from Group IIIA of the periodic table of elements and at least one element or a mixture of elements from Group VA of the periodic table of elements. Illustrative examples of III-V compound semiconductors that can be used as material for the layer include, but are not limited to: GaAs, InP, InAs, GaP, InSb, GaSb, GaN, InGaAs, InAsP, InGaAsP, GaNAsP and InAsSb. Preferably the III-V compound semiconductor is one of GaAs optionally including In, or one of InSb optionally including As. The layer can be replaced by a hetero structure comprising semiconductor compound materials.

One may contemplate of several types of optical gain layers. The layer 5 can include a bulk wafer or a single layered material (as shown). However, also a III-V layer grown on another III-V bulk wafer can be used, e. g. InGaAs on InP. For example, the III-V compound semiconductor material can be a multilayered material including different III-V compound semiconductors stacked upon each other. Throughout this disclosure it is also referred to a III-V material or to a III-V compound, III-V layer, or general compound semiconductors. The optical gain layer is suitable for implementing a light source, such as a laser.

Further, electrical and/or optical connections 6 are provided that couple the components 3 with the optical gain layer 5. The optical and/or electrical contacts 6 go through the dielectric layer 4. While the electronic or photonic components 3 in the silicon-based semiconductor substrate 2, 3 or wafer are front-end electronics, the contacts 6 are back-end of the line elements.

Figure 2:
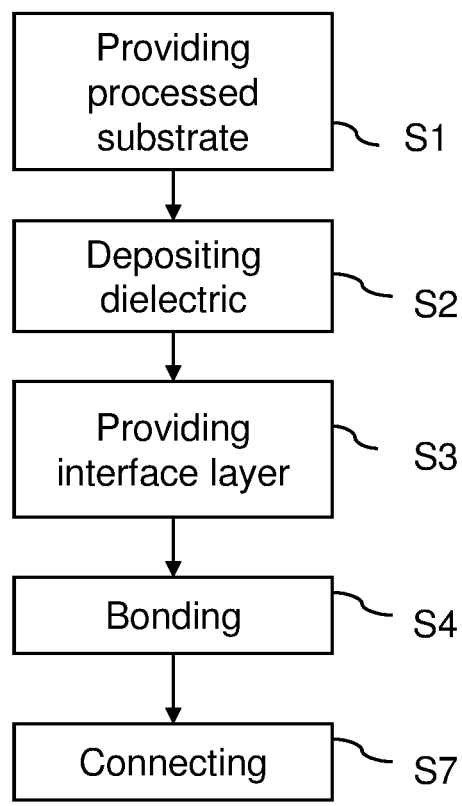
FIG. 2 shows a flow chart of method steps involved in a method for fabricating a semiconductor structure.

FIG. 2 shows a flowchart of method steps involved in a method for fabricating a semiconductor structure as shown in FIG. 1. First, the processed substrate 2, 3 is provided in step S1. The substrate 3, for example, can be a CMOS wafer that has been processed and provided with electronic and photonics components 3. The CMOS process can be performed at relatively high temperatures that are incompatible with, for example, compound semiconductor materials as used in the optical gain layer 5. After having processed the components in the silicon-based substrate 2, a dielectric 4 is deposited in step S2. Preferably, the dielectric layer is an interlayer dielectric one in a CMOS process (IDL1), for example silicon dioxide. Next, an optical gain layer is provided in step S3. The optical gain layer 5 can be, for example, provided on a substrate. Next, bonding is performed between the optical gain layer and the dielectric layer (step S4). Bonding temperatures can range between 200° C. and 600° C., for example. Finally, connections 6 are provided between the optical gain layer 5 and the substrate 2 of front-end of the lined components (step S7).

Next, further embodiments of semiconductor structures or chips and their fabrication methods are shown with respect to a pre-processed CMOS wafer which is bonded with a semiconductor compound material, preferably III-V compound material. Generally, optical gain material, i.e., III-V compound material, is bonded on top of a wafer that comprises electronics and photonics. The bonding is performed before copper or aluminum-based back-end processing steps are initiated, and the first interlayer dielectric ILD1 is used as an interface layer.

Figure 3:
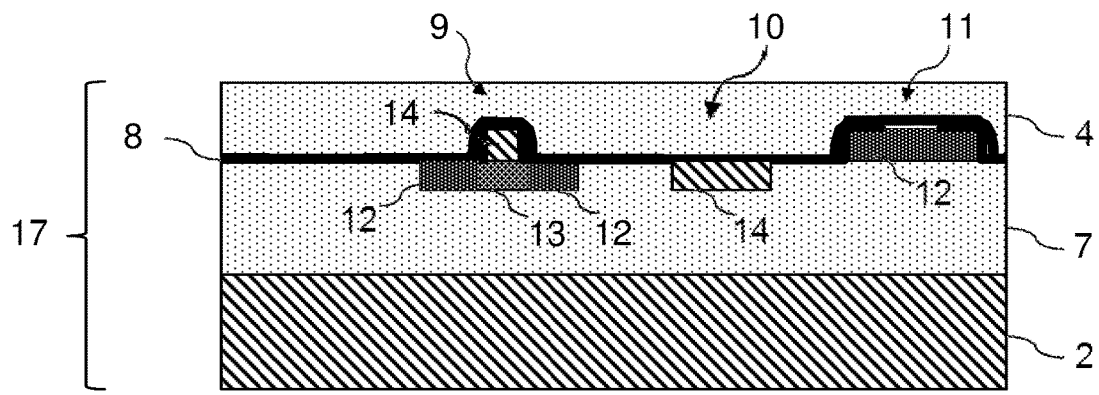
FIG. 3 shows a schematic diagram of an embodiment of a processed semiconductor substrate.
Figure 4:
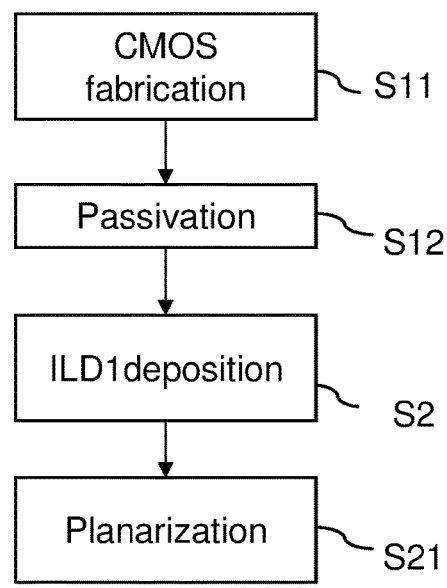
FIG. 4 is a flow chart for an embodiment of a method for providing a processed semiconductor substrate.

FIG. 3 shows a schematic diagram of a CMOS wafer stack comprising integrated electronics and passive photonics. FIG. 4 is a flow chart of the production steps involved in manufacturing the CMOS Wafer 17 of FIG. 3. The CMOS wafer 17 is fabricated along conventional CMOS technologies in step S11. The CMOS wafer 17 comprises a silicon substrate 2 in which, for example, a transistor 9, a silicon waveguide 10 and a poly silicon waveguide or resistor 11 is implemented. For example, the standard CMOS transistor 9 comprises source and drain 12 in terms of highly doped silicon and a channel region 13 of doped silicon. Undoped silicon regions are indicated by reference sign 14. A passivation layer 8 is provided as silicon nitride. The passivation layer 8 serves as a diffusion barrier. On top of the passivation layer 8, interlayer dielectric ILD1 is deposited (step S2). Further, the interlayer dielectric 4 is planarized in step S21 so as to obtain the smooth surface. CMOS fabrication may also include steps of implantation and annealing. After planarization, for example through chemical-mechanical polishing, a III-V semiconductor compound layer 4 can be bonded to the CMOS wafer 17 containing all front-end electronics.

Figure 5:
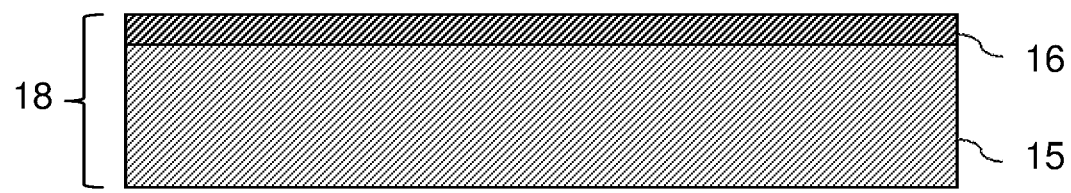
FIG. 5 shows a schematic diagram of an embodiment of a compound semiconductor layer on a substrate.
Figure 6:
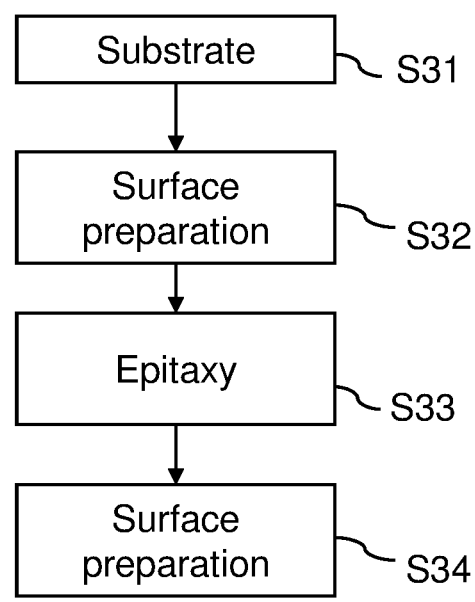
FIG. 6 is a flow chart for an embodiment of a method for providing a pre-processed compound semiconductor substrate.
Figure 9:
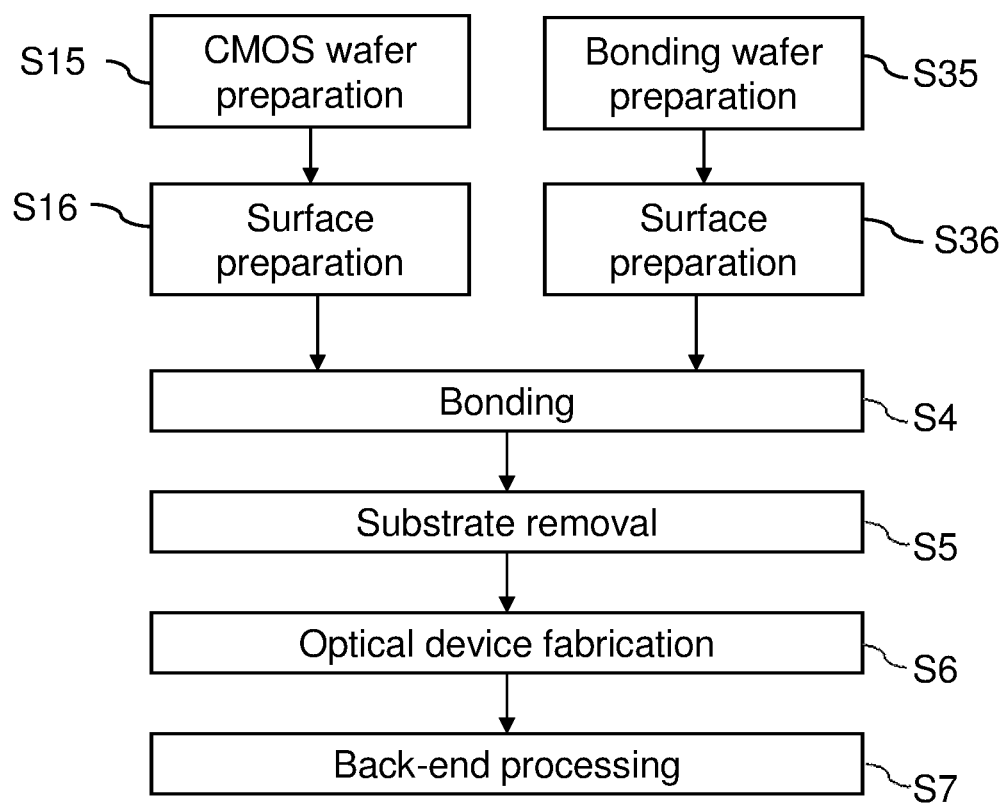
FIG. 9 is a flow chart of an embodiment of a method for fabricating a semiconductor structure.

FIG. 5 shows a schematic diagram of an embodiment of a compound semiconductor or germanium on a substrate, and FIG. 6 illustrates a flowchart for providing the compound semiconductor. We may also refer to a bonding wafer 18 optionally including a layer stack with a quantum well. First, the substrate is provided in step S31, wherein the substrate can comprise indium, phosphate gallium, arsenide gallium, nitride or other compounds. The bonding wafer 18 comprises the substrate 15 and the active semiconductor compound material 16. After a surface preparation step of the substrate 15 (step S31), a multiple quantum well structure or a quantum well structure can be formed by epitaxy. Optionally, the surface of the grown optical active layer in terms of a III-V layer 16 can be planarized or polished to improve its bonding properties. Next, the CMOS wafer 17 and the bonding wafer 18 are bonded together. This results in the configuration shown in FIG. 7. FIG. 9 shows a flow chart including the processes according to FIGS. 4 and 6 as steps S15, S16, S35, S36.

Figure 7:
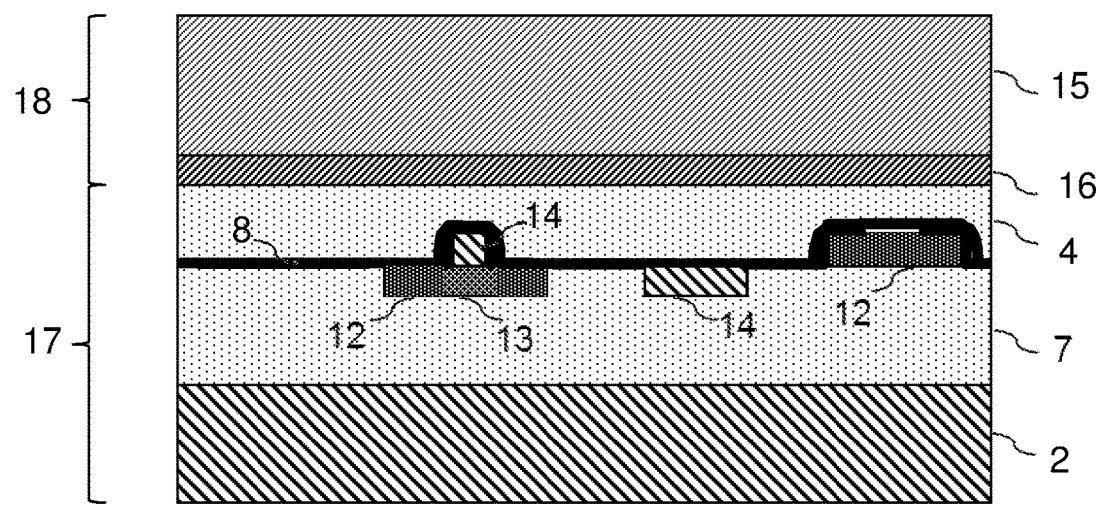
FIGS. 7 and 8 show schematic diagrams of an embodiment of a bonded semiconductor structure and illustrate method steps involved in the fabrication of a bonded semiconductor structure.

FIG. 7 shows the CMOS wafer 17 where the front-end electronics are bonded to the ILD1 4 with the bonding wafer 18 comprising the substrate 15 and for example a quantum well structure 16. The bonding process is performed at temperatures between 150° C. and 450° C. In certain embodiments, the temperature for the bonding is between 200° C. and 300° C. The bonding process is, for example, performed in a furnace and in a vacuum or in a suitable gaseous environment. In some embodiments, the bonding is performed at a pressure below 80 kPa. However, one can contemplate of other bonding parameters with respect to the atmosphere, temperature and pressure. E.g. some bonding processes can be performed at room temperature.

After bonding, in step S4, the substrate 15 of the bonding wafer 18 can be removed in step S5. The substrate 15 can be removed by grinding, wet chemical etching, CMP, smart cut or a combination thereof. Other conventional technologies can be contemplated to remove the substrate 15 from the functional III-V region 16. In some embodiments, a wet chemical etchant containing HCl is used. After substrate removal, a structure as shown in FIG. 8 is obtained.

The optical active layer 16 comprising the semiconductor compound bonded to the interlayer dielectric 4 can be a full-layer stack comprising a quantum well. However, one can also contemplate of having the III-V compound layer 16 as a seed layer for further epitaxial growth. The CMOS wafer containing electronics and photonics may withstand temperatures between 450° C. and 650° C. so that a re-growth of III-V semiconductor material can be performed. Next, in step S6, the III-V layer is processed and structured for realizing optical devices, such as lasers or other light sources. Finally, in step S7, the back-end processing is realized providing interconnects and external contacts.

Figure 8:
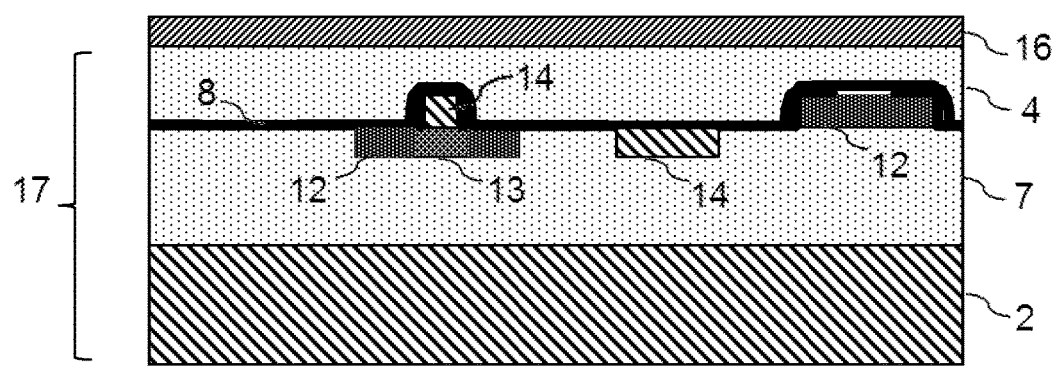
Figure 10:
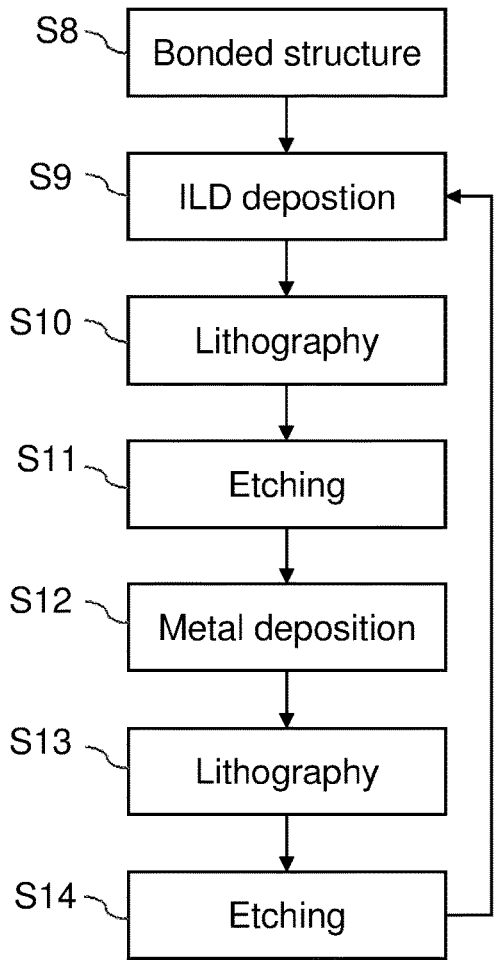
FIGS. 10 and 11 are flow charts of embodiments of a method for back-end processing a bonded semiconductor structure.

FIG. 10 illustrates an exemplary flowchart for back-end processing of the structure indicated in FIG. 8. The bonded structure provided in step S8 comprises the front-end electronics in the CMOS wafer 17 and active optical devices structured in the optical active region in terms of the III-V semiconductor compound 16. According to one embodiment, an interlayer dielectric is deposited, for example by oxide sputtering, spin-on glass or other conventional methods in step S9. Next, lithography and etching steps S10, S11 can be performed after which the metal deposition (step S12) in terms of aluminum or silicon is performed. Again, after lithography and etching steps S13, S14, further interlayer dielectrics can be deposited until the desired interconnects are realized. This is indicated by the arrow connecting step S14 with step S9.

Figure 11:
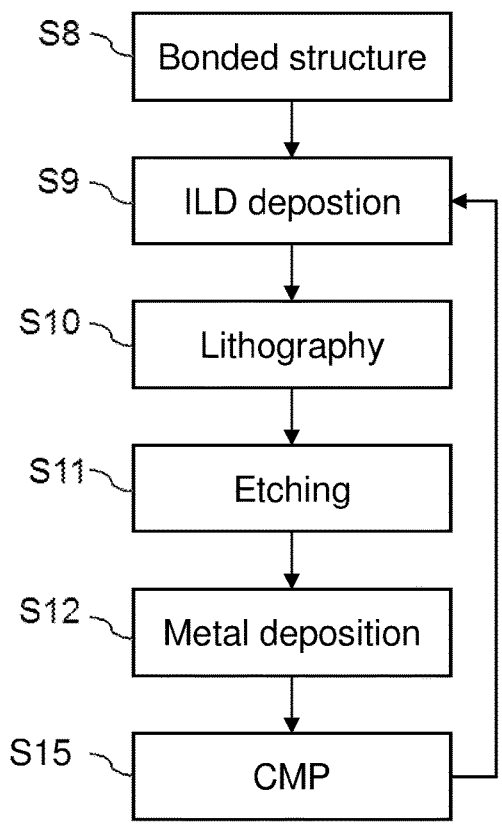

An alternative back-end processing flowchart is given in FIG. 11. Instead of lithography and etching after the metal deposition in step S12, chemo-mechanical polishing is performed. Again, as explained with respective FIG. 10, steps S9 through S15 are performed as often as necessary to realize the metal layers as back-end of line interconnects.

Figure 12:
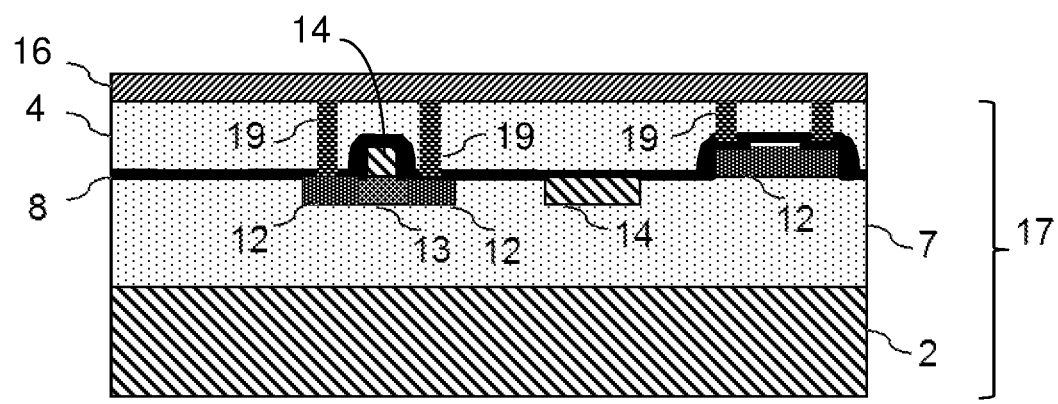
FIGS. 12 and 13 show schematic diagrams of another embodiment of a bonded semiconductor structure and illustrate method steps involved in the fabrication of a bonded semiconductor structure.

One may contemplate of an alternative embodiment of the semiconductor structure and a corresponding method for fabricating such. E.g., contacts protruding contacts fabricated during the CMOS process may be considered. FIG. 12 shows a preprocessed CMOS wafer 17 where, for instance, tungsten contacts 19 protrude from the active electronic or photonic components in the CMOS wafer. Instead of tungsten, also other conductors can be contemplated, such as molybdenum, palladium, nickel or the like. FIG. 12 shows the bonded compound layer 16 attached to the tungsten contacts 19. The bonded III-V layer 16 can either be regarded as a full layer stack or seed layer suitable for re-growth of III-V compounds.

Figure 13:
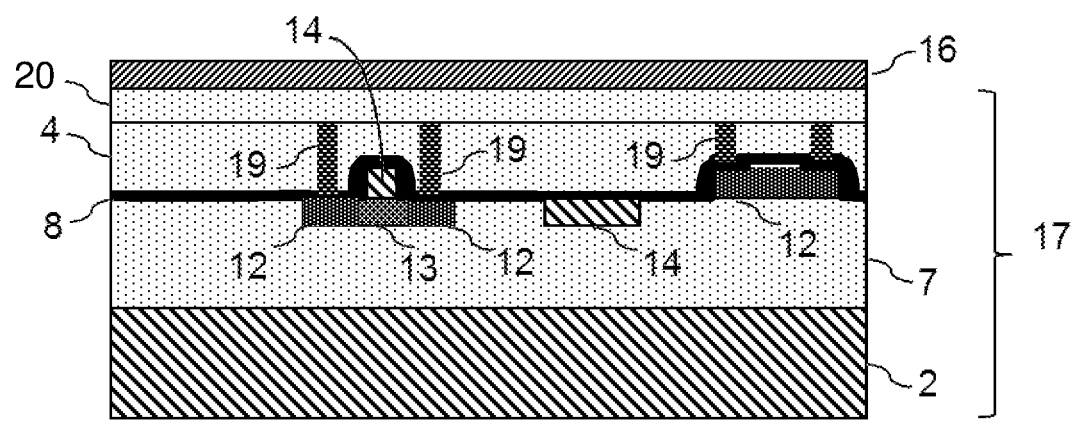

Another embodiment of integrating III-V compounds with CMOS technology is shown in FIG. 13. After having deposited the interlayer dielectric 1 ILD1 4 M1 oxide 20 is deposited. The M1 oxide comprising silicon dioxide is, for example, planarized and polished such that the III-V material can be bonded. Also copper can be located in the M1 oxide layer 20. In this example, a re-growth of III-V material is inhibited because the temperature budget is too low. Hence, the III-V layer is preferably a layer stack containing a quantum well and contacts such that the quantum wells may be used for a laser, an optical amplifier or a LED implementation.

Figure 14:
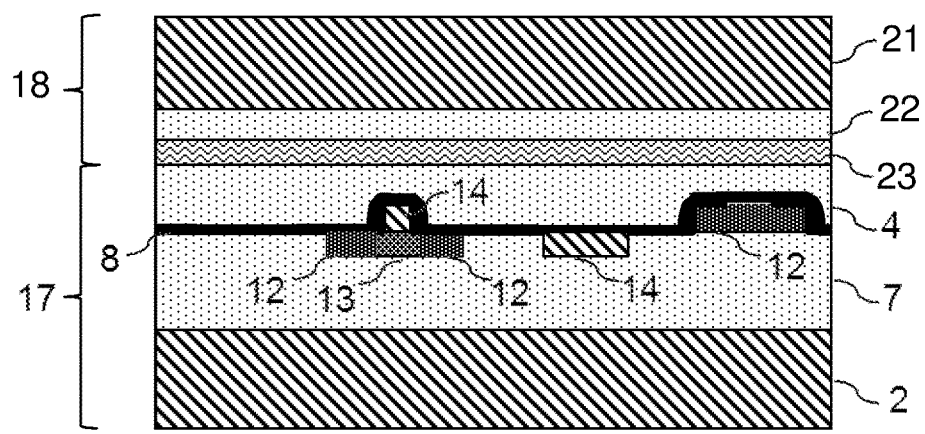
FIGS. 14-15 show schematic diagrams of an embodiment of a bonded semiconductor structure using a germanium layer as optical gain layer and illustrate method steps involved in the fabrication of a bonded semiconductor structure.
Figure 15:
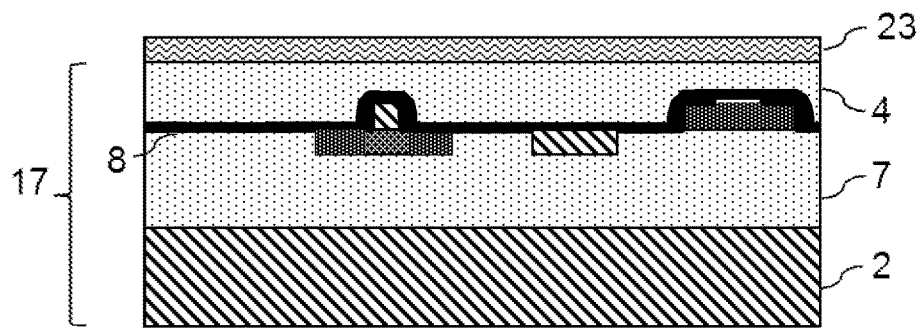
Figure 16:
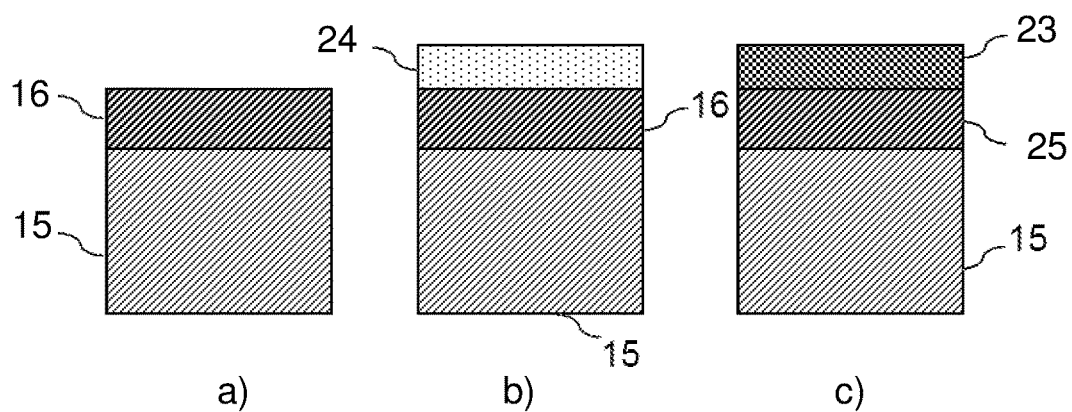
FIG. 16 shows stacks with optically active materials having bonding improving layers.

FIGS. 14 through 16 relate to schematic diagrams where germanium is used as an optical gain layer material. FIG. 4 shows the bonded structure of the processed CMOS wafer 17 to which germanium 23 is bonded. The germanium layer 23 is provided on a silicon substrate 21 with a silicon oxide interlayer 22. Germanium exhibits optical gain under certain conditions and can be processed along the lines of the III-V compound materials mentioned before. The substrate 21 can be removed by chemo-mechanical polishing, grinding, dry or wet chemical etching, smart cut, or a combination thereof. The silicon dioxide 22 acting as a buffer layer can be removed either by dry, chemical etching, wet chemical etching or a combination thereof. As a result, a CMOS front-end with bonded integrated active optical gain material in terms of germanium 23 is obtained.

One may contemplate of improving the bonding between the optical gain layer with the dielectric layer of the ILD1 layer by a cladding film or layer. FIG. 16 shows alternatives of treating the bonding wafer surface. FIG. 16 shows the substrate 15 which can be a substrate suitable for germanium or III-V compound semiconductors. The layer 16 corresponds to the III-V layer or germanium.

FIG. 16A shows a bonding wafer without any cladding, e.g. comprising III-V material.

FIG. 16B illustrates a silicon oxide cladding 24 wherein silicon dioxide may act as an adhesion promoter and a passivation or protection layer. One advantage of a silicon dioxide cladding is in its improved heat conductivity. One may also contemplate of other materials, such as aluminum oxide which is illustrated in FIG. 16C. The layer stack comprises aluminia Al2O3 25 on top of the III-V compound layer stack 16. The same claddings can be used when germanium is employed as the optical gain material. FIG. 16C refers to a silicon substrate 15 with a germanium-on-insulator stack (GOI) including a silicon oxide layer 16 and an optically active layer 25 containing germanium.

Figure 17:
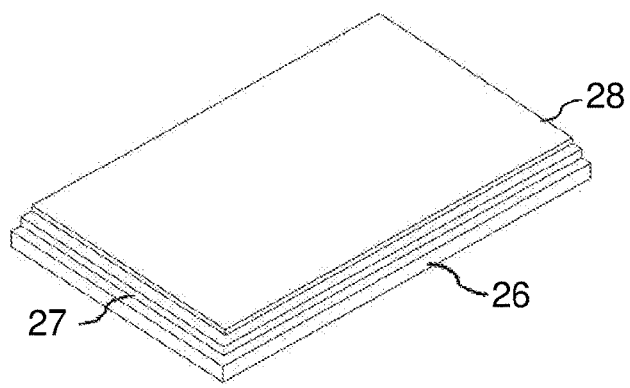
FIGS. 17-22 show perspective views of processed semiconductor structures and illustrate method steps involved in the fabrication of an embodiment of a light source with integrated front-end electronics and photonics.

FIGS. 17-22 show perspective views of processed CMOS wafers and illustrate method steps involved in the fabrication of a light source with an integrated front-end on one chip. After forming the optically active layer, for example in terms of a III-V compound semiconductor layer, the III-V layer is structured. FIG. 17 shows a perspective view of the silicon CMOS wafer 26 containing the entire driving security or the front-end for the combined photonics and electronics chip to be produced. In FIG. 17, the inter-layer dielectric ILD1 27 is shown to which the optically active material 28 is bonded. The structure as shown in FIG. 17 is ready for processing. Usually, alignment markers are provided in this semiconductor substrate 26. The alignment markers are used to relatively align structuring tools as used for processing the semiconductor material. The same alignment markers used for processing the CMOS wafer 26 are used for structuring the optically active layer 28.

Figure 18:
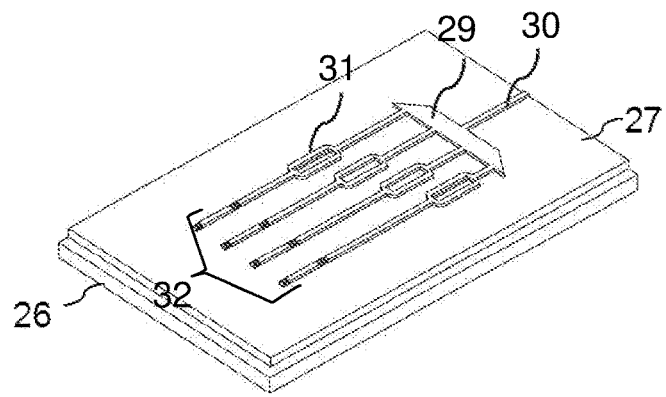

For example, the optically active layer 28 is structured as illustrated in FIG. 18. The optically active material is structured in terms of an optical waveguide 30, a multiplexer 29 in terms of an arranged waveguide grating, modulating devices 31 and for example distributed feedback lasers 32. One can contemplate of other active or passive photonic components that are implemented through the III-V active layer which is structured.

Figure 19:
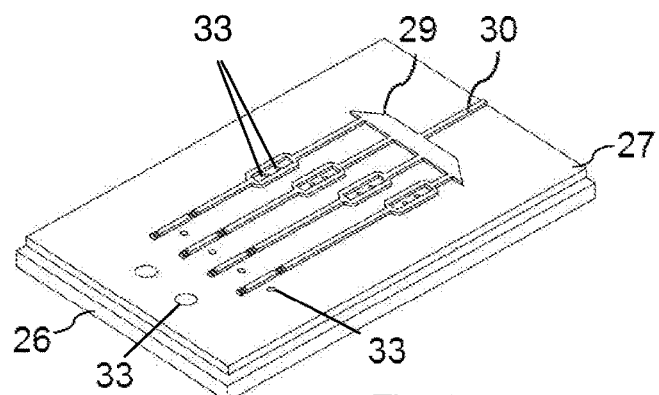
Figure 20:
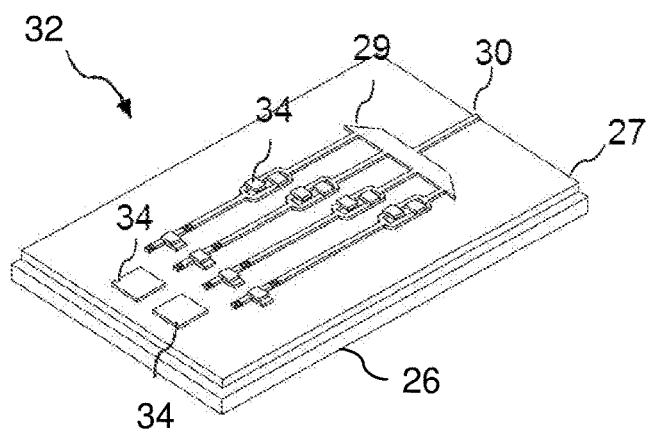
Figure 21:
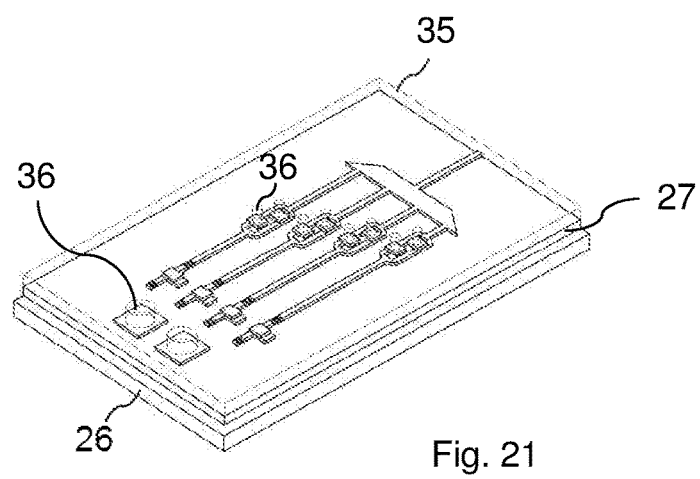
Figure 22:
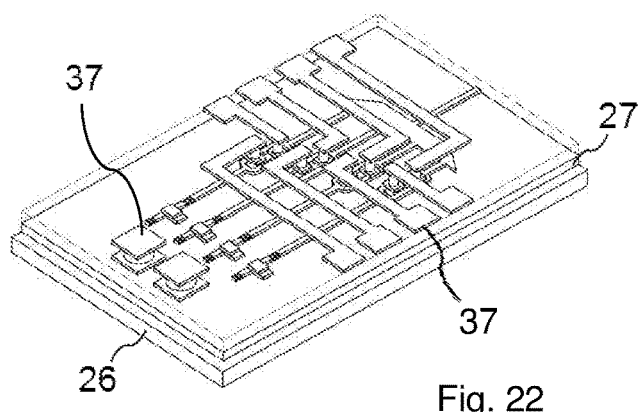

Next, as shown in FIG. 19, vias or openings 33 are provided within the ILD1 to couple with the front-end electronics below in the CMOS wafer 26. Next, an M1 metallization process is performed resulting in metal contacts 34 as shown in FIG. 20. After the M1 metallization, an M1 oxide 35 is deposited onto the structure as shown in FIG. 21. Further, openings 36 are structured so that in a further metallization step contacts 37 are realized as shown in FIG. 22.

In principle, the conventional back-end of the line wiring schemes can be realized, where subsequently oxide and metal is deposited and patterned using, for instance, chemical vapor deposition or physical vapor deposition, lithography and chemical-mechanical polishing. As a result, an integrated photonic and electronic chip is implemented and realized.

The proposed integration of integrated light sources in terms of optically active material in combination with pre-fabricated CMOS front-end wafers allows that small, reliable, fast and easy to manufacture electro-optical chips can be produced. Rather than bonding pre-fabricated light sources and pre-fabricated active semiconductor circuitry, the bonding of III-V compound materials with CMOS wafers and subsequent processing of the III-V semiconductor material allows for an efficient integration of photonics and electronics. The bonding and integration after the transistor formation in the CMOS domain reduces the thermal stress on the compound layers and therefore leads to a more reliable production process with improved material quality. The direct electric and/or optical connection between the front-end components in the CMOS wafer to the active photonic components in the bonded active gain layers lead to shorter transmission distances and more reliable signal exchanges.

The disclosed semiconductor structures can be part of a larger semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either an intermediate product, such as a motherboard, or an end product. The end product can be any product that includes integrated circuit chips, ranging from toys and other low-end applications to advanced computer products having a display, a keyboard or other input device, and a central processor.

LIST OF REFERENCE CHARACTERS 1 semiconductor structure
2 substrate
3 active electronic components
4 dielectric layer
5 interface layer or optical gain layer
6 contact
7 interlayer dielectric
8 diffusion barrier
9 transistor
10 wave guide
11 wave guide/resistor
12 highly doped silicon
13 doped silicon
14 silicon
15 compound semiconductor substrate
16 compound semiconductor
17 CMOS wafer
18 bonding wafer
19 contact
20 metal 1 (M1) oxide
21 silicon substrate
22 silicon oxide
23 germanium layer
24 cladding
25 silicon oxide
26 CMOS wafer with front-end electronics and photonics
27 inter-layer dielectric 1 (ILD1)
28 III-V compound epitaxial layer stack
29 arranged wave guide grating
30 output wave guide
31 modulator
32 dielectric Bragg reflector/distributed feedback laser
33 via/opening
34 metal 1 (M1) metallization
35 metal 1 (M1) oxide cladding
36 via/opening
37 metal 2 (M2) metallization
S1-S36 method steps

What is claimed is:

1. A method of manufacturing a semiconductor structure comprising:
   providing a silicon substrate;
   integrating electronic and photonic components with the silicon substrate to form a processed complementary metal-oxide semiconductor (CMOS) layer that overlies the silicon substrate and includes the electronic and photonic components;
   depositing a passivation layer that overlies the processed CMOS layer and the electronic and photonic components therein;
   depositing a dielectric interlayer over the passivation layer;
   bonding an interface layer comprising a III-V material to a surface of the dielectric interlayer such that the electronic and photonic components of the processed CMOS layer are communicatively connected to the bonded interface layer by electrical and photonic contacts that penetrate the dielectric interlayer;
   removing an inverted substrate that is adhered to and overlies the bonded interface layer; and
   epitaxially growing a layer of the III-V material from the bonded interface layer between 120° C. and 650° C., wherein the electronic and photonic components of the processed CMOS layer are front-end components and are capable of operation after exposure to temperatures between 120° C. and 650° C.

2. The method of manufacturing a semiconductor structure of claim 1, wherein the epitaxially grown layer of the III-V material comprises a laser.

3. The method of manufacturing a semiconductor structure of claim 1, wherein the epitaxially grown layer of the III-V material comprises an optical amplifier.

4. The method of manufacturing a semiconductor structure of claim 1, wherein the epitaxially grown layer of the III-V material comprises a light-emitting diode.

5. The method of manufacturing a semiconductor structure of claim 1, wherein the passivation layer comprises silicon nitride.

6. The method of manufacturing a semiconductor structure of claim 1, wherein the dielectric interlay comprises silicon dioxide.

7. The method of manufacturing a semiconductor structure of claim 1, wherein the electronic and photonic components of the processed CMOS layer comprise one or more silicon-based waveguides.

8. The method of manufacturing a semiconductor structure of claim 1, wherein the bonded interface layer is bonded to the surface of the dielectric interlayer between 200° C. and 300° C.

* * * * *